(12) United States Patent
Grupp

(10) Patent No.: US 6,261,943 B1
(45) Date of Patent: Jul. 17, 2001

(54) METHOD FOR FABRICATING FREE-STANDING THIN METAL FILMS

(75) Inventor: Daniel E. Grupp, Palo Alto, CA (US)

(73) Assignee: NEC Research Institute, Inc., Princeton, NJ (US)

( * ) Notice: Subject to any disclaimer, the term of this patent is extended or adjusted under 35 U.S.C. 154(b) by 0 days.

(21) Appl. No.: 09/499,983

(22) Filed: Feb. 8, 2000

(51) Int. Cl.[7] .................................................. H01L 21/4763

(52) U.S. Cl. .......................... 438/619; 438/611; 438/628; 438/977; 438/978

(58) Field of Search ..................................... 438/589, 592, 438/595, 611, 619, 644, 670, 928, 977, 978

(56) References Cited

U.S. PATENT DOCUMENTS

| | | | |
|---|---|---|---|
| 4,372,803 | * 2/1983 | Gigante | 156/626 |
| 5,096,791 | 3/1992 | Yahalom | 430/5 |
| 5,577,309 | * 11/1996 | Frank et al. | 29/25.42 |
| 5,631,198 | * 5/1997 | Hartauer | 438/53 |
| 5,721,801 | 2/1998 | Boysel | 385/130 |

OTHER PUBLICATIONS

Paviot, V.M. et al., "Measuring the Mechanical Properties of Thin Metal Films by Means of Bulge Testing of Micromachined Windows", Materials Research Society Symp. Proc., vol. 356, 1995.

* cited by examiner

Primary Examiner—Charles Bowers
Assistant Examiner—William M. Brewster
(74) Attorney, Agent, or Firm—Andrew G. Isztwan

(57) ABSTRACT

Methods for fabricating a free-standing thin metal film are provided. In one method, a sacrificial silicon nitride membrane structure is provided comprising a silicon wafer having first and second surfaces, a first silicon nitride layer applied to the first surface of the silicon wafer and a second silicon nitride layer applied to the second surface of the silicon wafer. The second silicon nitride layer and the silicon wafer are etched to provide a window that exposes a predetermined area of the first silicon nitride layer, whereby the exposed predetermined area of the front silicon nitride layer comprises a sacrificial silicon nitride membrane unsupported by any auxiliary substrate over the predetermined area. A thin metal film is then deposited on the first silicon nitride layer. Finally, the sacrificial silicon nitride membrane is removed, whereby the portion of the thin metal film exposed by the removal of the silicon nitride membrane comprises the free-standing thin metal film.

28 Claims, 4 Drawing Sheets

METHOD FOR FABRICATING FREE-STANDING THIN METAL FILMS

FIELD OF THE INVENTION

The present invention relates to the field of materials fabrication, and in particular to a method for fabricating very thin metal films that are unsupported by any auxiliary substrate over a predetermined area.

BACKGROUND OF THE INVENTION

Thin metal films (also referred to as membranes) are useful in a broad array of devices, and especially in optical photonic devices, medical and chemical filters, x-ray lithography, and micro-electromechanical system devices ("MEMS," also referred to as micromachines). Thin metal films are also useful in enhanced light transmission apparatus, such as those disclosed in U.S. Pat. No. 5,973,316 assigned to NEC Research Institute, Inc., for example.

Recently, a need has emerged for thin metal films that are unsupported by a substrate, referred to herein as "free-standing thin metal films." Free-standing thin metal films are thin metal films that not supported by a substrate (any substantially solid material other than the thin metal film itself) over a predetermined area on either side of the metal film for mechanical stability or the like. The ability to make free-standing thin metal films opens a broad range of design possibilities in which the unique and substantial properties of metals (mechanical, structural, electrical, optical, thermal, etch resistance) may be exploited in new devices. However, due to the thinness of such metal films (typically on the order of several microns to less than a micron), manufacturing free-standing thin metal films is difficult. It is therefore desirable to provide practical and reliable methods for fabricating thin free-standing thin metal films.

SUMMARY OF THE INVENTION

Generally speaking, in accordance with the invention, methods for fabricating a freestanding thin metal film are provided. A first method comprises the steps of: (a) providing a sacrificial silicon nitride membrane structure comprising a silicon wafer having first and second surfaces, a first silicon nitride layer applied to the first surface of the silicon wafer and a second silicon nitride layer applied to the second surface of the silicon wafer, the second silicon nitride layer and the silicon wafer being etched to provide a window that exposes a predetermined area of the first silicon nitride layer, whereby the exposed predetermined area of the front silicon nitride layer comprises a sacrificial silicon nitride membrane unsupported by any auxiliary substrate over the predetermined area; (b) depositing a thin metal film on the first silicon nitride layer; and (c) removing the sacrificial silicon nitride membrane, whereby the portion of the thin metal film exposed by the removal of the silicon nitride membrane comprises the free-standing thin metal film.

A second method comprises the steps of: (a) providing a sacrificial silicon nitride membrane structure comprising a silicon wafer having first and second surfaces, a first silicon nitride layer applied to the first surface of the silicon wafer and a second silicon nitride layer applied to the second surface of the silicon wafer, the second silicon nitride layer and the silicon wafer being etched to provide a window that exposes a predetermined area of the first silicon nitride layer, whereby the exposed predetermined area of the front silicon nitride layer comprises a sacrificial silicon nitride membrane unsupported by any auxiliary substrate over the predetermined area; (b) applying a sacrificial photoresist layer to a surface of the first silicon nitride layer which is opposite that of the silicon wafer; (c) removing the sacrificial silicon nitride membrane, exposing a portion of the sacrificial photoresist layer through the etched window; (d) depositing a thin metal film on a surface of the sacrificial photoresist layer which is opposite that of the silicon wafer; and (e) removing the portion of the sacrificial photoresist layer exposed through the etched window, whereby the portion of the thin metal film exposed by the removed portion of the sacrificial photoresist layer comprises the free-standing thin metal film.

A third method comprises the steps of: (a) providing a sacrificial silicon nitride membrane structure comprising a silicon wafer having first and second surfaces, a first silicon nitride layer applied to the first surface of the silicon wafer and a second silicon nitride layer applied to the second surface of the silicon wafer, the second silicon nitride layer and the silicon wafer being etched to provide a window that exposes a predetermined area of the first silicon nitride layer, the window including side walls of the silicon wafer and the second silicon nitride layer; (b) applying a sacrificial photoresist layer to the second silicon nitride layer and the side walls of the etched window; (c) removing the first silicon nitride layer; (d) depositing a thin metal film on the surfaces of the silicon wafer and the sacrificial photoresist layer exposed by the removal of the first silicon nitride layer; and (e) removing the sacrificial photoresist layer, whereby the portion of the thin metal film within the etched window exposed by the removed sacrificial photoresist layer comprises the free-standing thin metal film.

The invention includes methods in which free-standing thin metal films may be fabricated by deposition on a variety of sacrificial membranes, the sacrificial membrane being removed after the metal deposition. Methods for fabricating the sacrificial membranes are also provided.

One goal of the present invention is to provide methods for fabricating free-standing thin metal films that avoid the use of strong acids (so-called "wet etches") on the metal film which may otherwise etch the metal film or degrade the mechanical attachment of the free-standing thin metal film to its peripheral supporting structure.

The free-standing thin metal films fabricated according to the present invention may be used in optical photonic devices in which a photonic structure is fabricated in a further step on or of the free-standing thin metal film. The lack of an auxiliary substrate can provide highly desirable performance improvements in such devices. Liquids may also be introduced to come into contact with the free-standing thin metal films which may alter the optical properties in a useful manner. Further, optical devices may utilize the free-standing thin metal films in which the films may be elastically altered in shape by electric fields or hydrostatic pressure.

The free-standing thin metal films fabricated according to the present invention may also be used as filters for liquids (particularly useful, for example, in medical techniques such as cell separation) if a sufficient filter pattern is etched into the membrane. The thinness of the freestanding thin metal film is beneficial in that flow rate in such filters can be maintained even while pore size is decreased.

Another use for free-standing thin metal films fabricated according to the present invention is in X-ray lithography, in which the opacity of certain metals to X-rays may be utilized advantageously as X-ray lithographic masks. In this type of use, the free-standing thin metal films etched with the desired pattern. Small feature size is aided by the thinness of the freestanding thin metal film. The free-standing thin metal films fabricated according to the present invention advantageously provide unobstructed etched apertures which are an improvement over traditional silicon nitride-supported masks, in which the silicon nitride auxiliary substrate obstructs the apertures.

Furthermore, free-standing thin metal films fabricated according to the present invention are useful in many MEMS applications. Actuators and sensors similar to those fabricated in silicon and related materials may instead be made of metal using the free-standing thin metal films described herein. The properties of a free-standing thin metal film may be very useful in such applications. For example, the reflectivity of a free-standing thin metal film may be useful in fabricating adjustable micromirrors.

Accordingly, an object of the invention is to provide methods for fabricating freestanding thin metal films that are not supported by a substrate (any substantially solid material other than the thin metal film itself) over a predetermined area on either side of the metal film for mechanical stability or the like.

Another object of the invention is to provide methods for fabricating free-standing thin metal films that are practical and reliably produce stable films.

A further object of the invention is to provide methods for fabricating free-standing thin metal films that do not require the use of wet etchants which might otherwise damage the films.

Other objects of the present invention will become more readily apparent in light of the following description in conjunction with the accompanying drawings.

DETAILED DESCRIPTION OF THE PREFERRED EMBODIMENTS

Generally speaking, the methods of the present invention avoid the use of strong wet etchants to fabricate a freestanding thin metal films by using a sacrificial substrate, which itself is a thin membrane. It has been found that wet etches undesirably tend to eat under the thin metal film and release it from a supporting structure surrounding the thin metal film. This effect is caused at least in part by a slight porosity of the thin metal film, as well as pinholes, grain boundaries, and cracks. Thus, the methods of the present invention preferably utilize dry etching mild solvents.

Each of the methods described herein for fabricating free-standing thin metal films begins with a sacrificial membrane of silicon nitride. Preferably, the sacrificial silicon nitride membrane has a thickness in the range of about 25 nm to about 500 nm, although thinner or thicker membranes may be used. These membranes are available from commercial sources, or they may be fabricated from silicon wafers covered on both sides with low-stress nitride.

Figure 1A:
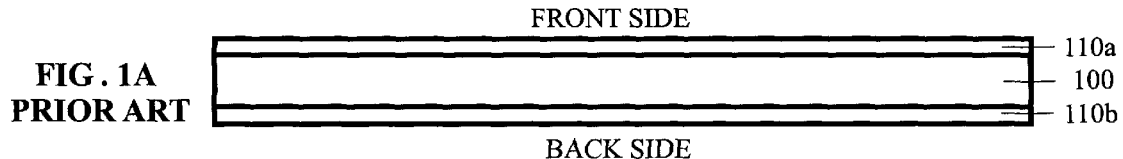
FIGS. 1A to 1E are cross-sectional schematic diagrams illustrating the fabrication of a sacrificial silicon nitride structure which is used by the methods of the present invention.

A preferable method for manufacturing a sacrificial silicon nitride membrane is illustrated in FIGS. 1A to 1D (it should be noted that all figures herein are exaggerated in size to better illustrate the invention, and may not be drawn to scale). As shown in FIG. 1A, a silicon wafer 100 is coated on both sides with a layer of silicon nitride 110a and 110b. The silicon nitride layers 110a and 110b preferably have a thickness of about 25 nm to about 500 nm, although thinner or thicker silicon nitride layers may be used depending on the desired thickness of the ultimate sacrificial silicon nitride membrane. Preferably, the silicon nitride is applied to the silicon wafer by either low pressure chemical vapor deposition or by plasma enhanced chemical vapor deposition as known in the art.

Figure 1B:
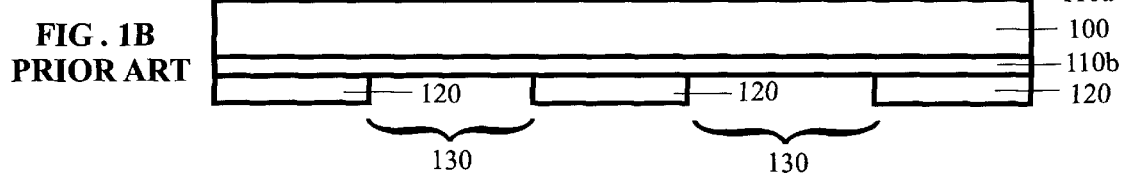

Next, as shown in FIG. 1B, a photoresistant material (a "photoresist layer") 120, such as Shipley 5214, is patterned on one of the silicon nitride layers 110b. The photoresist layer 120 preferably has a thickness of about 1 $\mu$m, and is patterned so as to leave open areas or "windows" 130 within which the sacrificial silicon nitride membrane or membranes ultimately will be formed. It will be understood at this juncture that one or more sacrificial silicon nitride membranes (and the resulting free-standing thin metal films as will be discussed below) may be fabricated on a single silicon wafer 100 by creating a corresponding number of windows 130, and that the size and shape of the sacrificial silicon nitride membrane or membranes (and therefore, also of the free-standing thin metal film of films) can be controlled by adjusting the size of the windows 130. The windows 130 are formed on the so-called "back" of the wafer, and the final sacrificial silicon nitride membrane will be formed from the silicon nitride layer 110a on the opposite or "front" side of the wafer. Preferably, the photoresist layer 120 is applied to the back silicon nitride layer 110b by spin coating or spray coating as is known in the art.

Figure 1C:
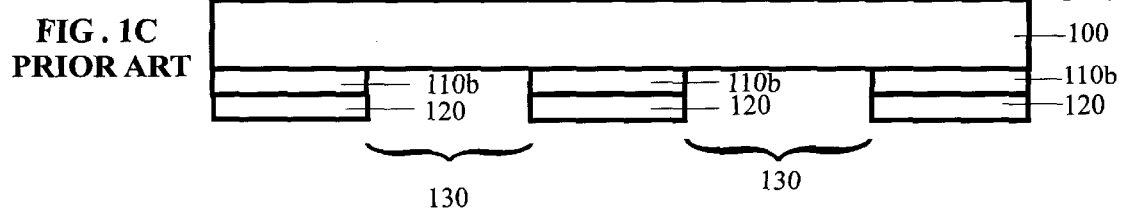

After the patterned photoresist layer 120 is formed, the portions of back silicon nitride layer 110b which are exposed through the windows 130 are then dry-etched until the silicon wafer 100 is exposed as shown in FIG. 1C. A preferred dry etch is $O_2:CF_4$ in the ratio of 4:40 sccm at a pressure of 100 mT and a power in a typical Reactive Ion Etch ("RIE") chamber of 100 W, giving an etch rate of 100 nm/minute. Reactive ion etching will be well understood to one of ordinary skill in the art. During this dry etch procedure, the patterned photoresist layer 120 ensures that the back silicon nitride layer 110b is removed only in those areas in which it was exposed through the windows 130.

Figure 1D:
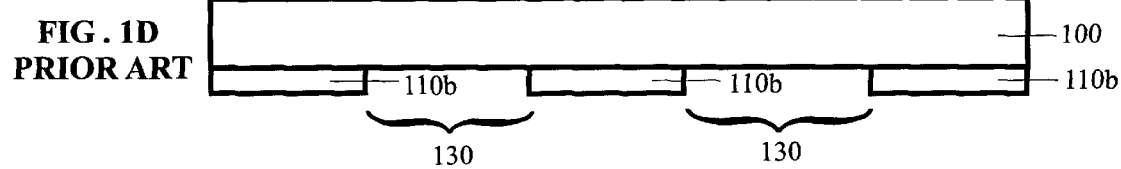

Next, as shown in FIG. 1D, the photoresist layer 120 is stripped, preferably by dissolving the photoresist in acetone or any other photoresist stripper as is well-known in the art.

Figure 1E:
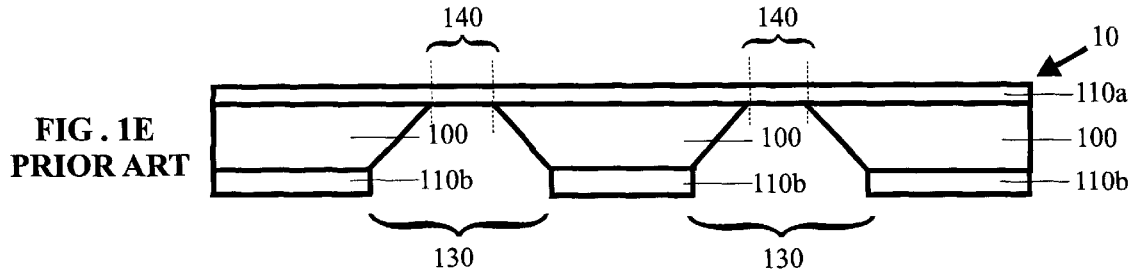

Finally, as shown in FIG. 1E, the silicon wafer 100 is wet-etched through the windows 130 in the back silicon nitride layer 110b all the way through the silicon wafer 100 and up to the surface of the front silicon nitride layer 110a. As a result, the portions of the front silicon nitride layer 110a which are exposed from the back side by the wet etch comprise the final sacrificial silicon nitride membrane 140. It will be noted that the sacrificial silicon nitride membrane 140 is supported about its periphery by portions of the front silicon nitride layer 110a which still adhere to the remaining portions of the silicon wafer 100 which were not removed by the wet etch. The preferred wet anisotropic etch is 22% wt KOH (potassium hydroxide) at 105° C. (just below the boiling point). The etch proceeds faster with higher temperatures and does not affect the silicon nitride. Etch rates are typically 2 $\mu$m per minute. Most processes in the prior art report etching at 80° C., which is very slow compared to maintaining the temperature just below the boiling point. Anisotropy is maintained, though the silicon surfaces remaining may not be as smooth (that is, they may be somewhat pitted). Thus to achieve a smoother and therefore typically more desirable sacrificial silicon nitride membrane, the preferred wet anisotropic etch described above is preferably employed. Preferably, after the wet etch is complete, the entire structure is thoroughly rinsed in de-ionized $H_2O$ and isopropanol.

Although the above method for fabricating a sacrificial silicon nitride membrane is preferred, it is to be understood that a sacrificial silicon nitride membrane constructed by any method is encompassed by the invention.

The structure shown in FIG. 1E, including the sacrificial silicon nitride membrane 140, the surrounding silicon nitride layer 110a, the supporting etched silicon wafer 100 and the remaining portions of the etched back silicon nitride layer 110b, will be referred to hereinafter as the sacrificial silicon nitride membrane structure 10. The sacrificial silicon nitride membrane structure 10 is preferably used as the initial workpiece for each of the embodiments of the method of the present invention, which will now be discussed in detail. In particular, there are three primary embodiments of the method of the present invention.

Figure 2A:
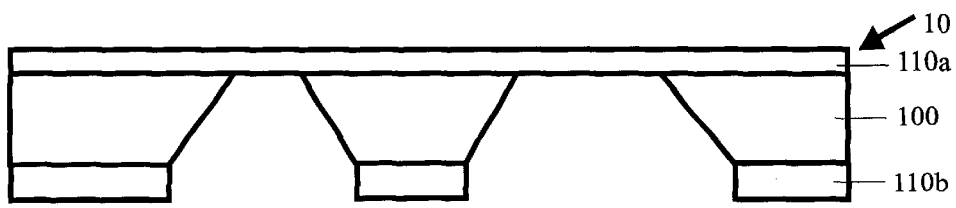
FIGS. 2A to 2C are cross-sectional schematic diagrams illustrating the fabrication a freestanding thin metal films according to a first embodiment of the present invention.
Figure 2B:
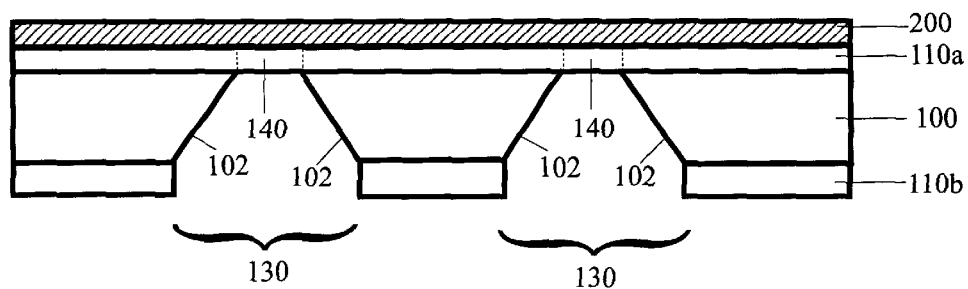

The first embodiment of the method of the present invention will now be described with reference to FIGS. 2A to 2C. In this embodiment, a thin metal film which will ultimately include the free-standing thin metal film is deposited directly on the sacrificial silicon nitride membrane. A sacrificial silicon nitride membrane structure 10 is first provided as shown in FIG. 2A. Next, a thin metal film 200 is deposited on the sacrificial silicon nitride membrane or membranes 140 as shown in FIG. 2B. The thin metal film 200 may be deposited on the silicon nitride by any of the well-known methods for doing so, such as by thermal evaporation or sputtering. Preferably, the thin metal film 200 is deposited with a thickness in the range of about 200 nm to about 600 nm, although thinner or thicker films are contemplated by the present invention. The thin metal film 200 is preferably deposited on the front silicon nitride layer 110a, including the sacrificial silicon nitride membrane or membranes 140, on the surface of layer 110a which is opposite that of the silicon wafer 100 so as to maintain the structural integrity of the thin metal film 200 as all stresses in the film will be horizontal to the point of adhesion. Alternatively, the thin metal film 200 may be deposited in the windows 130 from the back side of the sacrificial silicon nitride membrane structure 10, but in this case the thin metal film 200 may pull off of the side walls of the etched silicon wafer 100, which may be unintentional and therefore undesirable. Nevertheless, this alternative is also encompassed by the present invention. To reduce stress in the metal film, the temperature during deposition should preferably be kept as low as possible (preferably, close to room temperature), and most preferably the temperature should be maintained substantially uniform throughout the deposition process. Changing the source temperature (that is, the temperature of the metal evaporant as known in the art) and therefore the temperature of the thin metal film 200 during deposition will result in a stressed thin metal film 200 which could buckle and possibly fracture when the sacrificial silicon nitride membrane 140 is removed in the next step.

Figure 2C:
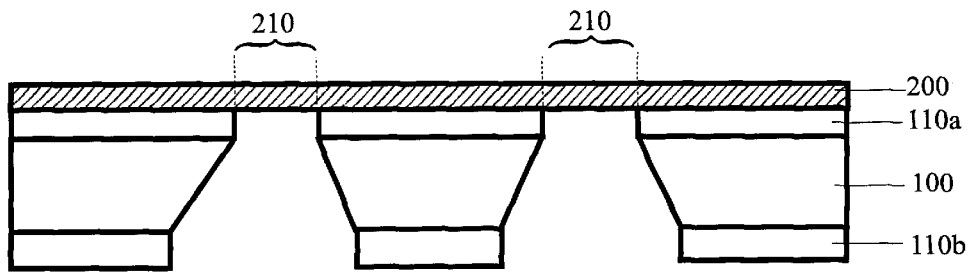

After the thin metal film 200 is deposited, the sacrificial silicon nitride membrane or membranes 140 are removed as shown in FIG. 2C, preferably by employing the RIE process described above. Nickel is not etched by the RIE process, so nickel may be used in the thin metal film 200 as an etch stop. The result is one or more (depending on the number of corresponding sacrificial silicon nitride membranes provided in the structure 10) free-standing thin metal films 210, each of which is unsupported by any auxiliary substrate over a predetermined area defined at its periphery by the etched silicon wafer 100. It will be noted that each free-standing thin metal film 210 is preferably supported about its periphery by portions of the thin metal film 200 which still adhere to the remaining portions of the front silicon nitride layer 110a which were not removed by the immediately preceding RIE process.

In all of the embodiments described herein, metals with low malleability are found to provide flatter free-standing thin metal films. While ductile metals are less likely to fracture, they are more likely to relieve internal stress by buckling. Nickel is a preferred metal for use as a thin metal film in the present invention as it very stiff yet not too brittle. Chromium is found to be brittle and not preferred, although still encompassed by the invention. The softer metals such as aluminum and silver are found to give free-standing thin metal films over large areas (5 mm×5 mm) but buckle easily, like wrinkled aluminum foil. Areas of up to $(30\ \mu m)^2$ (that is, 30 $\mu$m×30 $\mu$m) are found to give smooth films for the aforementioned aluminum and silver films. Reduced temperatures during deposition of the thin metal film would give larger smooth areas. It is also found that only one dimension of the free-standing thin metal film 210 need be provided within a non-fracturing size range so that the entire free-standing thin metal film 210 will not fracture. That is, if a particular thin metal film fractures at greater than 1 mm, then a long rectangle measuring 1 mm×10 mm will not fracture.

Moreover, in all of the embodiments of the present invention, the thin metal film 200 may be comprised of a single metal or a plurality layers of metals. Trilayer thin metal films can be successfully employed for ductile metals. For example, a thin metal film comprising a 50 nm surface layer of aluminum, a 300 nm core layer of nickel, and a 50 nm surface layer of aluminum (arranged Al—Ni—Al) has been successfully utilized, wherein the nickel gives the required structural integrity, and the surface properties of aluminum are useful in the final structure. Titanium has also been successfully used in such a trilayer thin metal film as the core layer. Titanium can be used by itself (that is, as a single layer thin metal film), but the RIE process is not self-limiting, so the titanium may be etched by the RIE process. In such a case, the RIE process must be stopped (as is well-known in the art) when the silicon nitride is removed and the titanium is exposed. The front surface (that is, the surface opposite the silicon nitride layer 110a which would otherwise be completely exposed) of titanium should also be protected during the RIE process, preferably by a photoresist layer which is removed by known methods after the RIE is complete. A trilayer chromium-titanium-chromium (Cr—Ti—Cr) thin metal film has also been successfully used in which the chromium is as thin as 10 nm, the chromium being impervious to the RIE etch. Silver also tends to etch in the RIE silicon nitride removal step. A trilayer thin metal film of aluminum-silver-aluminum (Al—Ag—Al) has been used. If the surface properties of the silver are desired, the aluminum may be removed by a 10 second wet etch in KOH, which will not etch the silver.

Figure 3A:
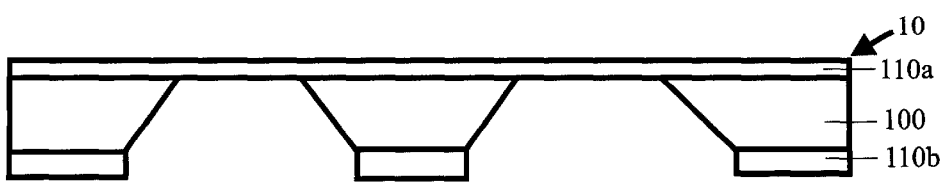
FIGS. 3A to 3F are cross-sectional schematic diagrams illustrating the fabrication a freestanding thin metal films according to a second embodiment of the present invention.
Figure 3B:
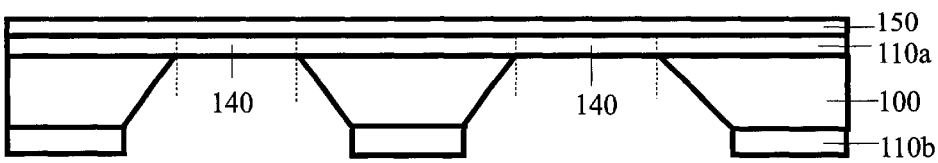
Figure 3C:
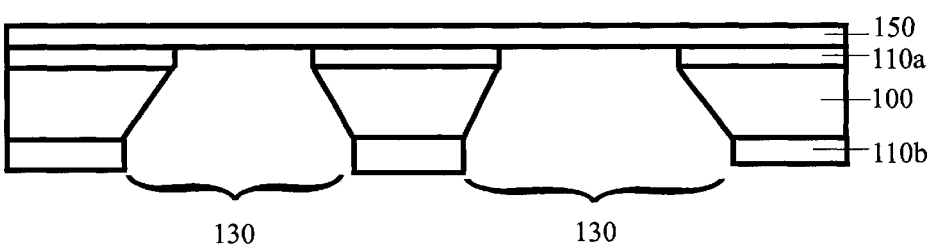
Figure 3D:
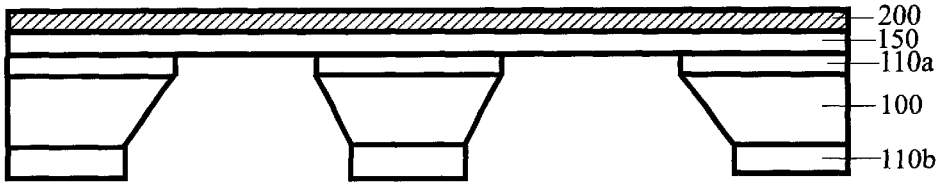
Figure 3E:
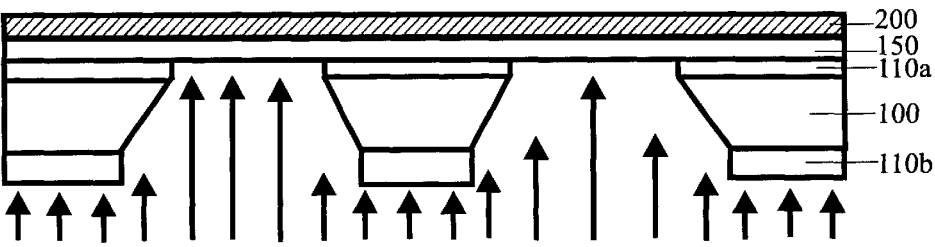
Figure 3F:
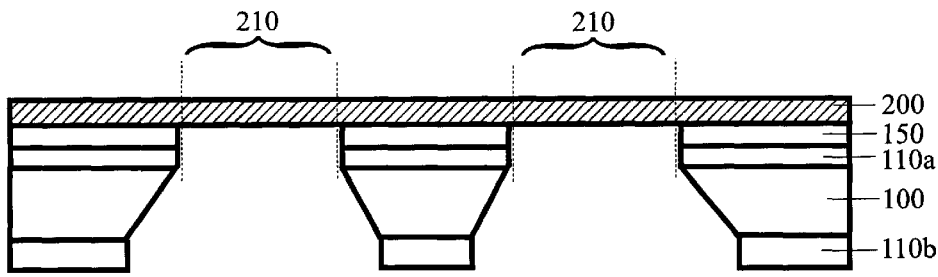

The second embodiment of the method of the present invention will now be described with reference to FIGS. 3A to 3F. In this embodiment, a second sacrificial layer of photoresist is employed between the sacrificial silicon nitride layer and the thin metal film to create a sacrificial photoresist membrane which provides a surface for fabricating the thin metal film and is then removed to create the free-standing thin metal film. A sacrificial silicon nitride membrane structure 10 is first provided as shown in FIG. 3A. Next, a sacrificial photoresist layer 150 is applied to the front surface of the silicon nitride membrane structure 10 as shown in FIG. 3B. In particular, the sacrificial photoresist layer 150 is applied on the front silicon nitride layer 110a on the surface thereof which is opposite that of the silicon wafer 100. The sacrificial photoresist layer 150 is preferably spun onto the front silicon nitride layer 110a, and is not exposed to any light that would normally expose it during the subsequent processing. As shown in FIG. 3C, the portions of the front silicon nitride layer 110a which are exposed through the windows 130 in the silicon nitride membrane structure 10 (that is, the sacrificial silicon nitride membrane or membranes 140) are then removed using the techniques described above (e.g., the RIE process), the removal process being stopped at the sacrificial photoresist layer 150. A thin metal film 200 may then be deposited on the front side of the photoresist layer 150 by known techniques as shown in FIG. 3D. After deposition of the thin metal film 200, the portions of the photoresist layer 150 which are accessible through the etched apertures in the silicon wafer 100 (that is, the sacrificial photoresist membranes) are removed. Preferably, the removal is accomplished by flood exposing (that is, exposing with light) the back side (that is, through the windows 130) of the photoresist layer 150 as indicated by the arrows representing light in FIG. 3E, and then removing the flood exposed portions of the photoresist layer 150 with a developer solvent and rinsing with water as shown in FIG. 3F. It should be noted that the portions of the photoresist layer 150 between the thin metal film 200 and the supporting silicon wafer 100 are not flood exposed in this procedure, and therefore continue to support portions of the thin metal film 200. Again, the result is one or more (depending on the number of corresponding sacrificial silicon nitride membranes provided in the sacrificial silicon nitride structure 10) free-standing thin metal films 210, each of which is unsupported by any auxiliary substrate over a predetermined area defined at its periphery by the remaining portions of the photoresist layer 150 adhering to the etched silicon wafer 100. This second embodiment has the advantage that the thin metal film metal 200 is only exposed to the developer solvent and water rinse, so that the thin metal film 200 is not unduly stressed during fabrication.

Figure 4A:
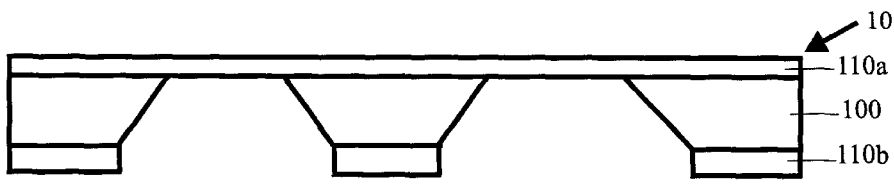
FIGS. 4A to 4E are cross-sectional schematic diagrams illustrating the fabrication a freestanding thin metal films according to a third embodiment of the present invention.
Figure 4B:
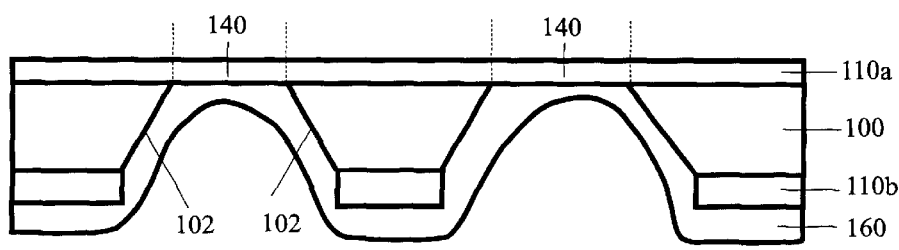
Figure 4C:
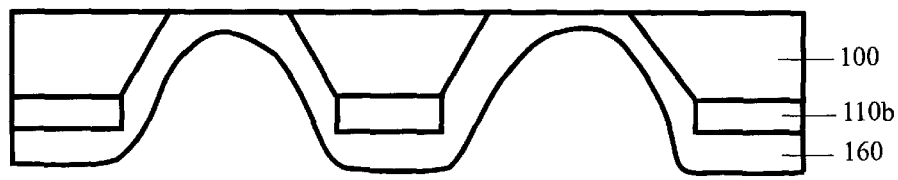
Figure 4D:
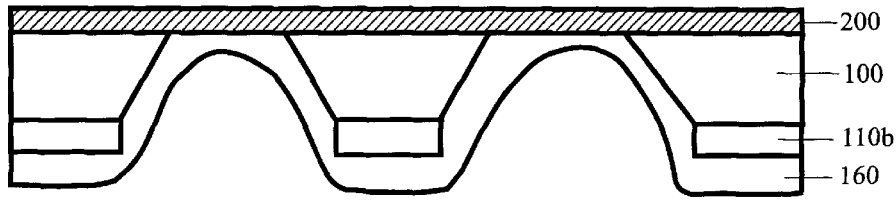
Figure 4E:
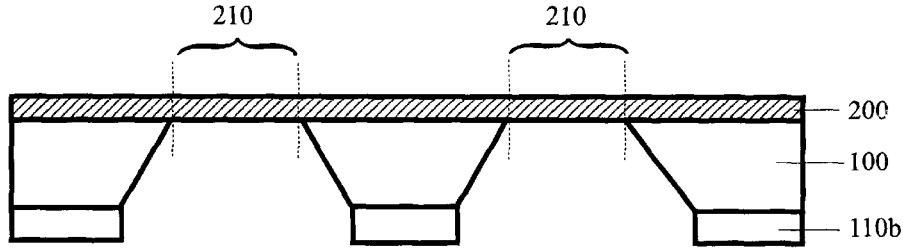

The third embodiment of the method of the present invention will now be described with reference to FIGS. 4A to 4E. In this embodiment, a sacrificial layer of photoresist is employed on the back side of the silicon nitride membrane structure 10. A sacrificial silicon nitride membrane structure 10 is first provided as shown in FIG. 4A. Next, a sacrificial photoresist layer 160 is applied to the back of the silicon nitride membrane structure 10 as shown in FIG. 4B. In particular, the sacrificial photoresist layer 160 follows the contours of the back of the silicon nitride membrane structure 10, including the remaining portions of the back silicon nitride layer 110b, the side walls 102 of the etched silicon wafer 100, and the back surface of the front silicon nitride layer 110a. If the sacrificial silicon nitride membranes 140 have a relatively large area (that is, an area greater than or equal to about $(100 \,\mu m)^2$), the sacrificial photoresist layer 160 is preferably applied by spin coating it onto the back of the silicon nitride membrane structure 10. If the sacrificial silicon nitride membranes 140 have a relatively small area (that is, an area less than about $(100 \,\mu m)^2$), the sacrificial photoresist layer 160 is preferably applied by spraying it onto the back of the silicon nitride membrane structure 10, although the sacrificial photoresist layer 160 may also be applied by spin coating it onto the back of the silicon nitride membrane structure 10 (which may result in a relatively thick substrate). In either case, and as in the second embodiment, the photoresist layer 160 is not exposed to any light that would normally expose it during the subsequent processing. As shown in FIG. 4C, the entire front silicon nitride layer 110a is then removed using the techniques described above (e.g., the RIE process), the removal process being stopped at the sacrificial photoresist layer 160. A thin metal film 200 may then be deposited on the front side of the structure, including the remaining portions of the etched silicon wafer 100 and the portions of the photoresist layer 160 revealed by the removal of the front silicon nitride layer 110a, by known techniques as shown in FIG. 4D. After deposition of the thin metal film 200, the photoresist layer 160 is then removed as shown in FIG. 4E. Preferably, the removal of the photoresist layer 160 is accomplished by flood exposing the entire photoresist layer 160 and then removing the flood exposed photoresist layer 160 with a developer solvent and rinsing with water as described above. Again, the result is one or more (depending on the number of corresponding sacrificial silicon nitride membranes provided in the sacrificial silicon nitride structure 10) free-standing thin metal films 210, each of which is unsupported by any auxiliary substrate over a predetermined area defined at its periphery by the remaining portions of the etched silicon wafer 100. This third embodiment is particularly advantageous in that it may provide a stronger supporting structure around the periphery of the free-standing thin metal film 210 because the adhesion of the thin metal film directly to the silicon wafer is usually stronger than the adhesion of the thin metal film to an intermediate photoresist layer as in the second embodiment. In addition, this third embodiment has the final structure does not contain any. organic materials, which is desirable in some applications.

In addition to thin metal films, the second and third embodiments described above may be useful for preparing thin films of materials that are insoluble in the photoresist developer or water. These materials may be other polymers, semiconductors, amorphous silicon, ceramics, or composites.

Furthermore, patterned free-standing thin metal films may be fabricated according to the above-described methods of the present invention. The patterning may be accomplished before or after the sacrificial layers or membranes are removed.

While there has been described and illustrated various methods for fabricating freestanding thin metal films, it will be apparent to those skilled in the art that variations and modifications are possible without deviating from the spirit and broad teachings of the invention which shall be limited solely by the scope of the claims appended hereto.

What is claimed is:

1. A method for fabricating a free-standing thin metal film, the method comprising the steps of:
   providing a sacrificial silicon nitride membrane structure comprising a silicon wafer having first and second surfaces, a first silicon nitride layer applied to the first surface of the silicon wafer and a second silicon nitride layer applied to the second surface of the silicon wafer, the second silicon nitride layer and the silicon wafer being etched to provide a window that exposes a predetermined area of the first silicon nitride layer, whereby the exposed predetermined area of the front silicon nitride layer comprises a sacrificial silicon nitride membrane unsupported by any auxiliary substrate over the predetermined area;

depositing a thin metal film on the first silicon nitride layer, wherein the thin metal film comprises a trilayer metal structure; and removing the sacrificial silicon nitride membrane, whereby the portion of the thin metal film exposed by the removal of the silicon nitride membrane comprises the free-standing thin metal film.

2. The method of claim 1, wherein the trilayer metal structure comprises a layer of nickel provided between two layers of aluminum (Al—Ni—Al).

3. The method of claim 1, wherein the trilayer metal structure comprises a layer of silver provided between two layers of aluminum (Al—Ag—Al).

4. The method of claim 1, wherein the trilayer metal structure comprises a layer of titanium provided between two layers of chromium (Cr—Ti—Cr).

5. A method for fabricating a free-standing thin metal film, the method comprising the steps of:

providing a sacrificial silicon nitride membrane structure comprising a silicon wafer having first and second surfaces, a first silicon nitride layer applied to the first surface of the silicon wafer and a second silicon nitride layer applied to the second surface of the silicon wafer, the second silicon nitride layer and the silicon wafer being etched to provide a window that exposes a predetermined area of the first silicon nitride layer, whereby the exposed predetermined area of the front silicon nitride layer comprises a sacrificial silicon nitride membrane unsupported by any auxiliary substrate over the predetermined area;

applying a sacrificial photoresist layer to a surface of the first silicon nitride layer which is opposite that of the silicon wafer;

removing the sacrificial silicon nitride membrane, exposing a portion of the sacrificial photoresist layer through the etched window;

depositing a thin metal film on a surface of the sacrificial photoresist layer which is opposite that of the silicon wafer; and removing the portion of the sacrificial photoresist layer exposed through the etched window, whereby the portion of the thin metal film exposed by the removed portion of the sacrificial photoresist layer comprises the free-standing thin metal film.

6. The method of claim 5, wherein the step of removing the sacrificial silicon nitride membrane comprises dry etching the sacrificial silicon nitride membrane.

7. The method of claim 6, wherein the dry etching comprises reactive ion etching (RIE).

8. The method of claim 5, wherein the step of removing the sacrificial photoresist layer further comprises flood exposing the sacrificial photoresist layer, dissolving the flood-exposed sacrificial photoresist layer with a developer solvent, and rinsing with water.

9. The method of claim 5, wherein the thin metal film comprises nickel.

10. The method of claim 5, wherein the thin metal film comprises aluminum.

11. The method of claim 5, wherein the thin metal film comprises chromium.

12. The method of claim 5, wherein the thin metal film comprises silver.

13. The method of claim 5, wherein the thin metal film comprises titanium.

14. The method of claim 5, wherein the thin metal film comprises a trilayer metal structure comprising a layer of nickel provided between two layers of aluminum (Al—Ni—Al).

15. The method of claim 5, wherein the thin metal film comprises a trilayer metal structure comprising a layer of silver provided between two layers of aluminum (Al—Ag—Al).

16. The method of claim 5, wherein the thin metal film comprises a trilayer metal structure comprising a layer of titanium provided between two layers of chromium (Cr—Ti—Cr).

17. A method for fabricating a free-standing thin metal film, the method comprising the steps of:

providing a sacrificial silicon nitride membrane structure comprising a silicon wafer having first and second surfaces, a first silicon nitride layer applied to the first surface of the silicon wafer and a second silicon nitride layer applied to the second surface of the silicon wafer, the second silicon nitride layer and the silicon wafer being etched to provide a window that exposes a predetermined area of the first silicon nitride layer, the window including side walls of the silicon wafer and the second silicon nitride layer;

applying a sacrificial photoresist layer to the second silicon nitride layer and the side walls of the etched window;

removing the first silicon nitride layer;

depositing a thin metal film on the surfaces of the silicon wafer and the sacrificial photoresist layer exposed by the removal of the first silicon nitride layer; and removing the sacrificial photoresist layer, whereby the portion of the thin metal film within the etched window exposed by the removed sacrificial photoresist layer comprises the free-standing thin metal film.

18. The method of claim 17, wherein the step of removing the sacrificial silicon nitride membrane comprises dry etching the sacrificial silicon nitride membrane.

19. The method of claim 18, wherein the dry etching comprises reactive ion etching (RIE).

20. The method of claim 17, wherein the step of removing the sacrificial photoresist layer further comprises flood exposing the sacrificial photoresist layer, dissolving the flood-exposed sacrificial photoresist layer with a developer solvent, and rinsing with water.

21. The method of claim 17, wherein the thin metal film comprises nickel.

22. The method of claim 17, wherein the thin metal film comprises aluminum.

23. The method of claim 17, wherein the thin metal film comprises chromium.

24. The method of claim 17, wherein the thin metal film comprises silver.

25. The method of claim 17, wherein the thin metal film comprises titanium.

26. The method of claim 17, wherein the thin metal film comprises a trilayer metal structure comprising a layer of nickel provided between two layers of aluminum (Al—Ni—Al).

27. The method of claim 25, wherein the thin metal film comprises a trilayer metal structure comprising a layer of silver provided between two layers of aluminum (Al—Ag—Al).

28. The method of claim 25, wherein the thin metal film comprises a trilayer metal structure comprising a layer of titanium provided between two layers of chromium (Cr—Ti—Cr).

* * * * *